United States Patent [19]
Okumura

[11] Patent Number: 5,620,346
[45] Date of Patent: Apr. 15, 1997

US005620346A

[54] CONNECTOR AND CONNECTOR TESTING APPARATUS

[75] Inventor: Hitoshi Okumura, Yokkaichi, Japan

[73] Assignee: Sumitomo Wiring Systems, Ltd., Japan

[21] Appl. No.: 397,745

[22] Filed: Mar. 2, 1995

[30] Foreign Application Priority Data

Mar. 3, 1994 [JP] Japan ..................... 6-060107
May 16, 1994 [JP] Japan ..................... 6-126868

[51] Int. Cl.$^6$ .................................. H01R 13/436
[52] U.S. Cl. ......................... 439/752; 439/488
[58] Field of Search ...................... 439/752, 595, 439/488

[56] References Cited

U.S. PATENT DOCUMENTS 5,120,269  6/1992  Endo et al. ..................... 439/752
5,147,222  9/1992  Hotea et al. .................... 439/752
5,160,283  11/1992  Fry et al. ....................... 439/752

FOREIGN PATENT DOCUMENTS 0511649  11/1992  European Pat. Off. .

Primary Examiner—Gary F. Paumen
Attorney, Agent, or Firm—Anthony J. Casella; Gerald E. Hespos

[57] ABSTRACT

A retainer 20 is rotatably mounted on a connector housing 11. When the retainer 20 is pivoted toward the connector housing 11, engaging projections 25 engage terminal fittings 16 inserted into corresponding terminal fitting cavities 3. Each engaging projection 25 is formed with a push-out slanting surface 25b and a push-in slanting surface 25c, the slanting surfaces 25b and 25c being sloped inversely from each other. The retainer 20 is formed with an elastic member 26 for producing a spring force. The elastic member 26 renders such a force as to push back the terminal fittings 16 until shoulder portions 16b of the terminal fittings 16 pass the push-out slanting surfaces 25b, while rendering such a force as to push the terminal fittings 16 to their proper mount positions after the shoulder portions 16b of the terminal fittings 16 reach the push-in slanting surfaces 25c.

12 Claims, 10 Drawing Sheets

CONNECTOR AND CONNECTOR TESTING APPARATUS

BACKGROUND OF THE INVENTION

1. Field of the Invention

The present invention relates to a connector and to a connector testing apparatus.

2. Description of the Prior Art

In general, in a connector realizable by inserting a terminal fitting into a connector housing, for example, an engaging portion, or a so-called lance, is formed in the connector housing and the terminal fitting is engaged with this engaging portion to be lockingly retained in a cavity therefor formed in the connector housing. The connector may also be provided with a double locking mechanism which uses a retainer to detect incomplete insertion of the terminal fitting and to securely lock the terminal fitting in the cavity.

A connector shown in FIG. 17 is known as an example of a connector provided with a double locking mechanism. The prior art connector of FIG. 17 includes a retainer 2 mounted into a connector housing 1 formed with a plurality of unillustrated cavities for accommodating terminal fittings by being inserted into the connector housing 1 in a direction of the arrow in FIG. 17. Terminal fittings 3 are inserted into the cavities of the connector housing 1 while the retainer 2 is held in a partial mount position. The retainer 2 then is pressed further to a full mount position. In its full mount position, the retainer 2 is engaged with the terminal fittings 3, thereby locking them in the connector housing 1.

With the above prior art connector, the retainer is likely to get separated. Further, if the terminal fittings 3 are incompletely inserted, the retainer 2 comes into contact with the terminal fittings 3 and cannot be inserted to its full mount position, with the result that a bottom part of the retainer 2 remains uninserted into the connector housing 1. In this case, an operator will feel from his experience that the retainer 2 is improperly mounted into the connector housing 1, and improper mounting of the retainer 2 is also visibly detectable. Incomplete insertion of the retainer 2 can be noticed in this way. The retainer 2 is designed to let the operator detect incomplete insertion, but neither to avoid incomplete insertion nor to actively urge insertion of the terminal fittings 3 to their proper mount positions.

Accordingly, with prior art connectors, there were cases where the improperly assembled connectors are brought to a next process when the operator became inattentive and overlooked improper mounting of the retainer.

Another problem is as follows. In order to efficiently assemble the connectors of the above construction, it is a common practice to transport a plethora of connector housings 1 to a working section where the terminal fittings 3 are inserted into the connector housings 1 after partially mounting the retainers 1 on the connector housings 1, so that the terminal inserting operation can be finished at one standing. However, with the above connectors, the retainers 2 partially mounted on the connector housings 1 are likely to be fully mounted due to vibrations produced during transportation. Since the terminal fittings 3 cannot be inserted if the retainers 2 are brought to their full mount positions before inserting the terminal fittings 3, it is necessary to move the retainers 2 to their partial mount positions. This operation is very cumbersome, reducing working efficiency. In order to prevent the retainers 2 from being brought to their full mount positions during transportation, a container for containing the connector housings 1 with the retainers 2 partially mounted thereon during transportation needs to have a special structure, which leads to an increased production cost.

Another problem is that a suitable testing apparatus for testing not only the electrical performance but also the correct positioning of the terminal fittings does not exist.

The object of the invention is to overcome the above problems.

SUMMARY OF THE INVENTION

A connector in accordance with the subject invention includes a retainer and a connector housing. The retainer is mounted on the connector housing, and thus cannot get separated.

Preferably, the retainer is biased by a biasing member and held in a locking position that preferably is close to the connector housing. Thus, the retainer is more securely held in its locking position.

Further, when a terminal fitting is inserted into the cavity formed in the connector housing, it firstly comes into contact with a push-out slanting surface of the locking portion which is preferably provided. When the terminal fitting is further inserted, it lifts the entire retainer against the biasing force from the biasing member while being in sliding contact with the push-out slanting surface, thereby moving the retainer away from the locking position.

If the terminal fitting is inserted with a specified force sufficient for the terminal fitting to pass the push-out slanting surface, the restoring force of the biasing member acts to insert the terminal fitting to its proper mount position, preferably because a push-in slanting surface pushes the terminal fitting in this direction.

If insertion of the terminal fitting is insufficient to the extent that the terminal fitting cannot pass the push-out slanting surface, the terminal fitting is not urged into, but out of the cavity so that this insufficiency may easily be detected. Even a terminal fitting which is considered to be incompletely inserted according to the prior art, normally passes the push-out slanting surface. Thus, the terminal fitting will, according to the invention, be securely inserted to its proper mount position.

According to the invention, the source of the push-out force which acts to push back the terminal fitting while the terminal fitting is passing along the push-out slanting surface acts conversely as a push-in force which assists to push the terminal fitting further into the cavity after the terminal fitting passes the push-out slanting surface. Thus, if the terminal fitting is inserted with a force sufficient for the terminal fitting to pass the push-out slanting surface, it can be securely inserted to its proper mount position due to an inertial force (static energy stored in the biasing member).

Preferably, the push-in slanting surface is more steeply sloped than the push-out slanting surface.

If the push-in slanting surface is more steeply sloped than the push-out slanting surface, the push-out force which acts to push back the terminal fitting passing along the push-out slanting surface is weaker than the push-in force which acts to push the terminal fitting to its proper mount position after the terminal fitting passes the push-out slanting surface.

Since the push-in force is stronger than the initially acting push-out force, the fitting terminal can be more securely inserted to its proper mount position.

Preferably, the connector comprises a terminal detecting member which is formed at the housing and which is contacted by the terminal fitting during its insertion to its proper mount position in the cavity. It is further preferred that the terminal detecting member projects biasingly into the cavity.

As a further preferred embodiment, the connector comprises an engaging portion which becomes engageable when the terminal fitting contacts the terminal detecting member, and another engaging portion formed at the retainer which engages the engaging portion when the terminal fitting is in its proper mount position. Accordingly, the terminal fitting contacts the terminal detecting member when the terminal fitting is inserted to its proper mount position in the cavity of the housing, with the result that the engaging portion formed at the terminal detecting member becomes engageable. If the retainer is displaced to its locking position thereafter, the engaging portion of the retainer is engaged with the engaging portion of the terminal detecting member and the terminal fitting is locked by the locking portion of the retainer.

When the terminal fitting is not yet inserted into the cavity, the engaging portion of the terminal detecting member does not become engageable. Accordingly, even if the retainer is displaced to its locking position, the engaging portion of the retainer is not engageable with the engaging portion of the terminal detecting member, thereby eliminating the likelihood that the retainer is inadvertently held in the locking position.

As described above, according to the inventive connector, the retainer is not to be held in its locking position when the terminal fitting is not inserted into the cavity. In other words, the retainer is prevented from being brought to its locking position at the stage where the terminal fitting is not yet mounted. This makes an operation of inserting the terminal fitting into the housing efficient and obviates the need for a container having such a special structure as to prevent the retainers from being brought to their locking positions during transportation.

In that case, it is preferred that the terminal detecting member, after insertion of the terminal fitting to its proper mount position, projects out of the connector housing, thereby forming the engaging portion, and wherein the retainer is formed with an engaging hole, forming the other engaging portion, for engaging the engaging portion projecting out of the connector housing, so that the retainer is held in the locking position.

Preferably, the engaging portion of the terminal detecting member projects laterally out of the connector housing and, wherein the engaging hole is formed in a lateral side wall of the retainer.

The embodiments featuring the terminal detecting member can be considered to be an invention even if the retainer is not mounted on the connector housing.

However, it is preferred that the retainer is rotatably mounted with respect to the connector housing.

In a preferred embodiment of the inventive testing apparatus, the connector holder comprises a receptacle for receiving the connector housing, wherein the retainer, in its locking position, is flush with the hood.

BRIEF DESCRIPTION OF THE DRAWINGS

These and other objects, features and advantages of the present invention will become more apparent upon a reading of the following detailed description and accompanying drawings in which.

DETAILED DESCRIPTION OF THE PREFERRED EMBODIMENT

Figure 1:
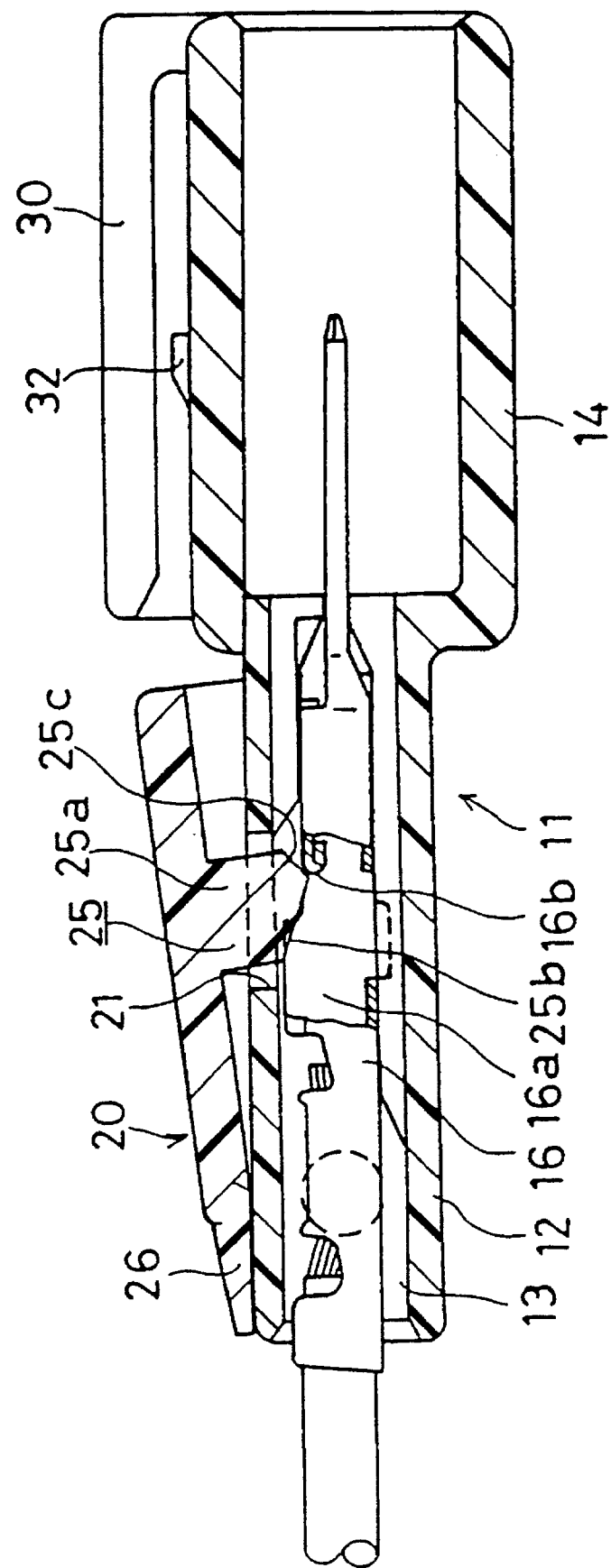
FIG. 1 is a side view in section of a connector when a retainer is in an intermediate pivotal position.

Hereafter, a first embodiment of the invention is described with reference to FIGS. 1 to 9.

A connector housing 11 is made of synthetic resin (plastic) and includes a main body 12 of flat box-like shape. Two partition walls 12a extending in the longitudinal direction of the main body 12 are formed in the main body 12, thereby defining three terminal fitting cavities 13 arranged in horizontally parallel relationship. In front of the cavities 13, there is formed a slightly wide rectangular hood 14 which is engageable with an unillustrated female connector housing. Further, in order to suspend the entire connector housing 11 from an unillustrated fixed member, a pair of brackets 30 having a hooked cross-section are formed at the opposite lateral ends of the upper surface of the hood 14. A bracket extending from the fixed member is engageable between these brackets 30. An engaging projection 32 for engagement with the unillustrated bracket is formed on the upper surface of the hood 14 between the brackets 30.

It should be noted that engaging portions or lances which are normally formed in the terminal fitting cavities for first engagement with the terminal fittings are not formed in the connector housing 11 of this embodiment.

Figure 2:
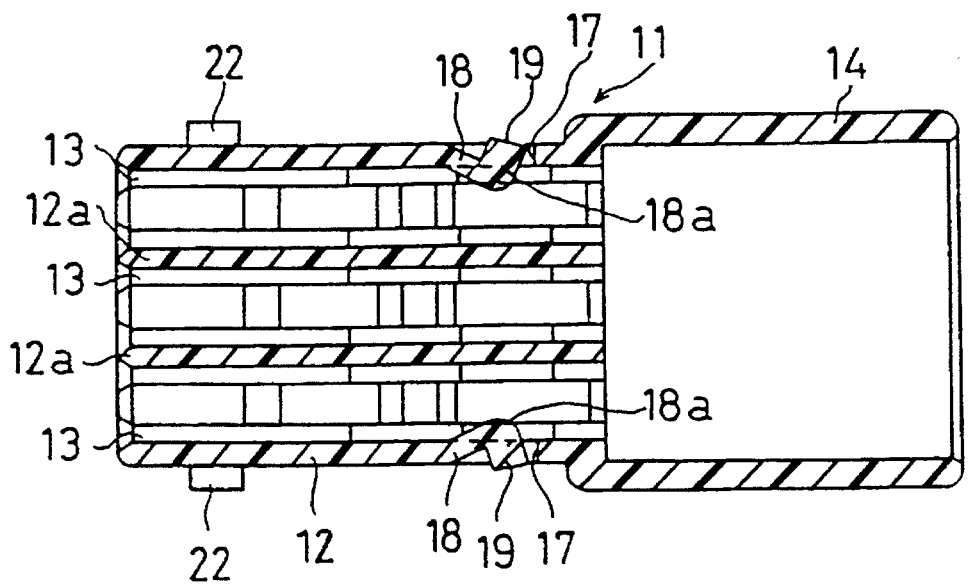
FIG. 2 is a plan view in section of a connector housing before terminal fittings are inserted.

As shown in FIG. 2, an opening 17 is formed in each of the lateral side walls of the main body 12. Terminal detecting members 18 are formed unitarily with the main body 12 such that they are positioned in the corresponding openings 17. As clearly seen in FIG. 2, one end (left end in FIG. 2) of each detecting member 18 is integral with the main body 12 and the other end thereof is bent outward substantially in L-shape. During the absence of terminal fittings 16 in the cavities 13 located at the opposite lateral sides of the main body 12, bent portions 18a of the detecting members 18 are located in the corresponding cavities 13 and engaging portions 19 thereof do not project outward from the outer surfaces of the opposite lateral side walls of the main body 12. When the terminal fittings 16 are inserted into the cavities 13 at the opposite lateral sides from the left side in FIG. 2, lateral surfaces of the terminal fittings 16 come into contact with the corresponding bent portions 18a of the detecting members 18, thereby causing the detecting members 18 to undergo elastic deformation to project outward. As a result, the engaging portions 19 project outward through the openings 17, so that they are engageable with a retainer 20 to be described later. In the upper wall of the main body 12, there are formed rectangular through holes 21 in communication with the respective cavities 13 so that locking projections 25 of the retainer 20 can enter the corresponding cavities 13.

Figure 3:
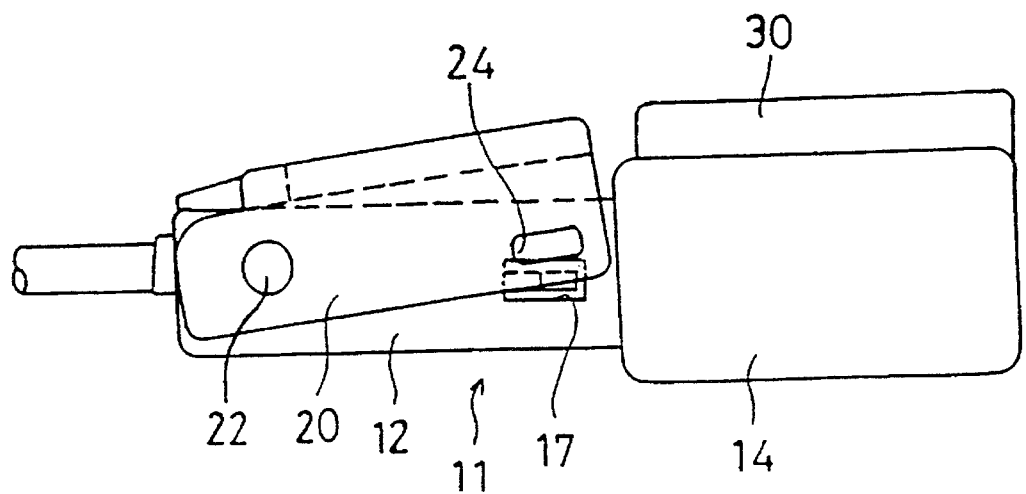
FIG. 3 is a side view of the entire connector.
Figure 4:
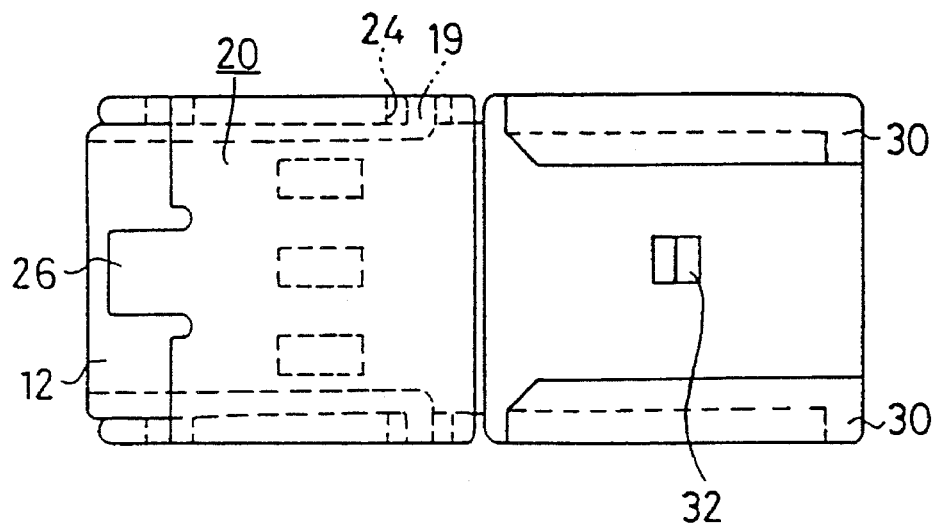
FIG. 4 is a plan view of the entire connector.
Figure 5:
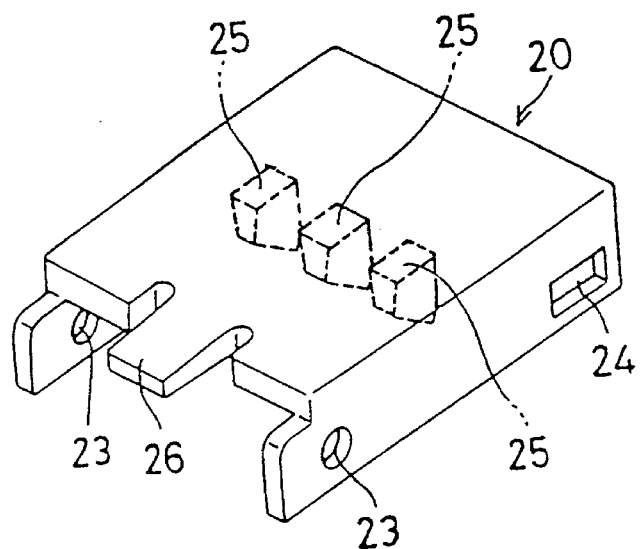
FIG. 5 is a perspective view of the retainer.
Figure 6:
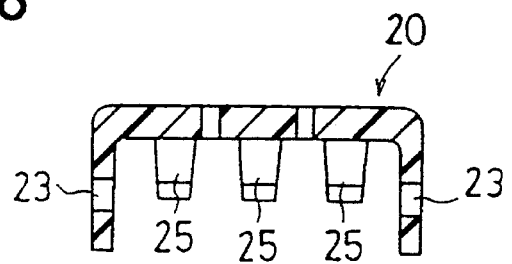
FIG. 6 is a section of the retainer.
Figure 7:
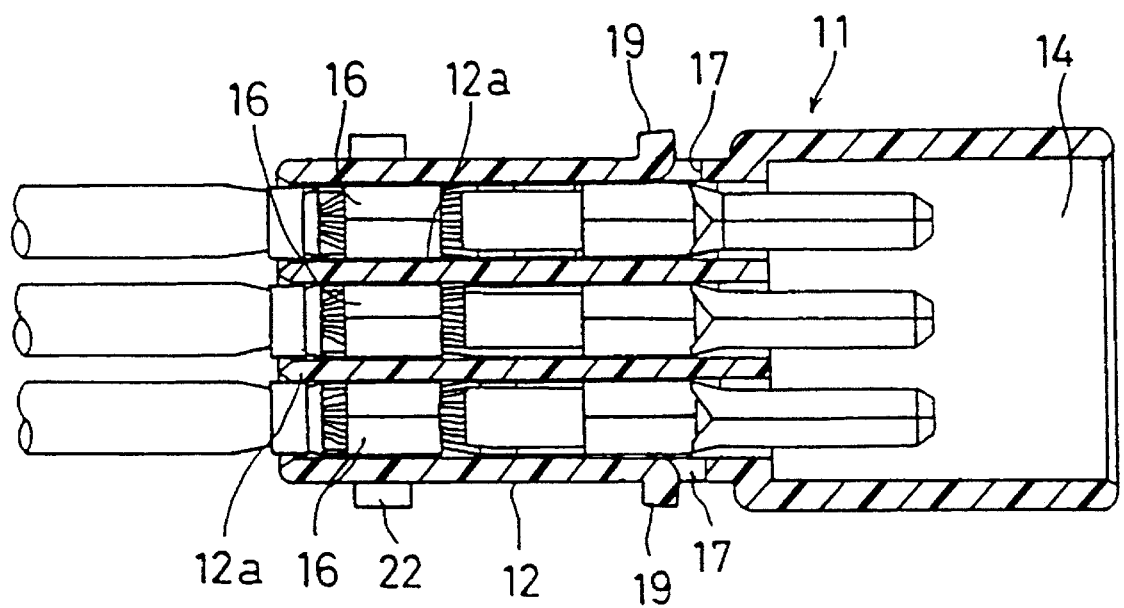
FIG. 7 is a plan view in section of the connector housing after terminal fittings are inserted.
Figure 8:
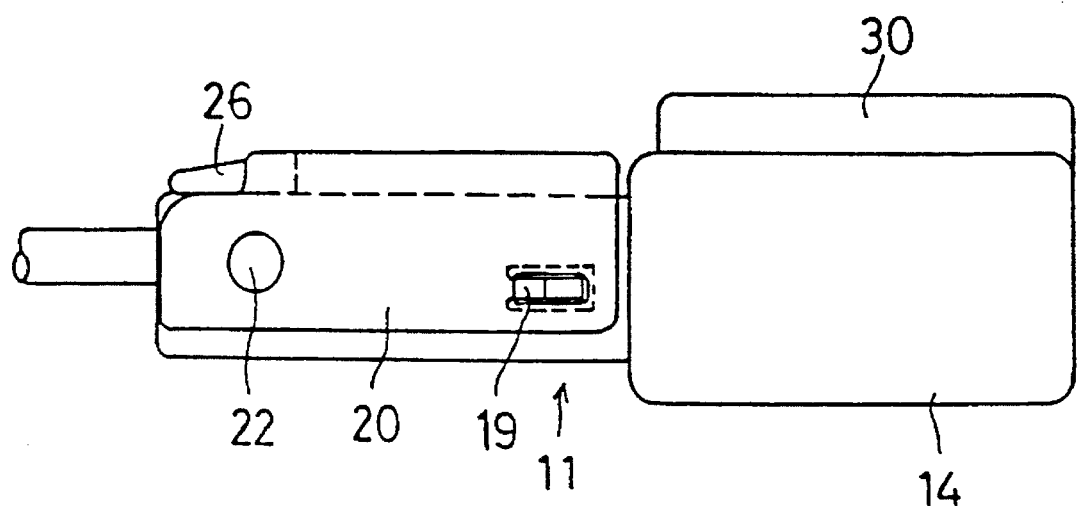
FIG. 8 is a side view of the connector when the retainer is in its locking position.
Figure 9:
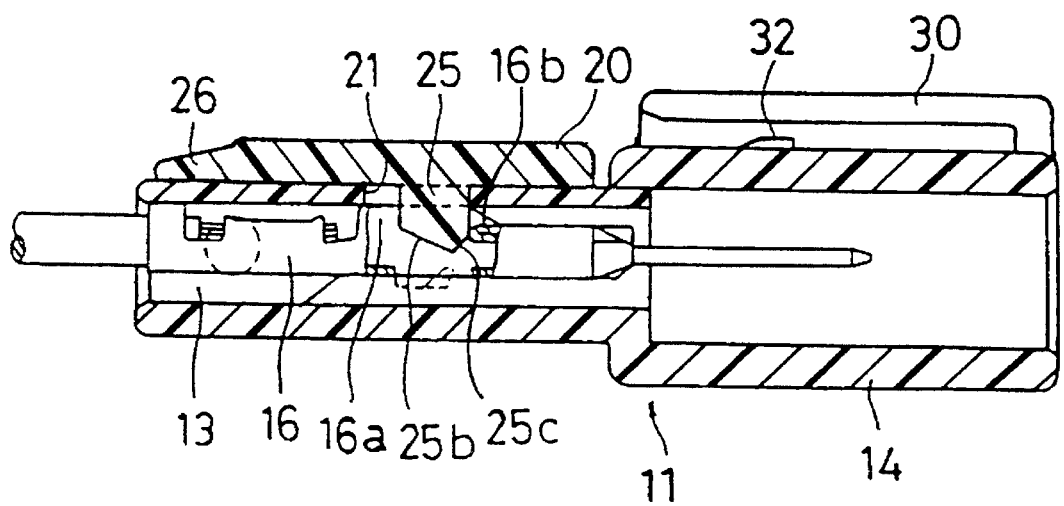
FIG. 9 is a side view in section of the connector when the retainer is in its locking position.

On the other hand, a pair of support shafts 22 projecting outward are unitarily formed with the opposite lateral side walls of the main body 12 at a longitudinal end opposite from the one adjacent the hood 14. The retainer 20 is rotatably mounted on the support shafts 22. As shown in FIG. 5, the retainer 20 is of such hood-like shape as to cover the upper and opposite lateral side surfaces of the main body 12. Holes 23 are formed at the left ends of the opposite lateral side walls of the retainer 20. The retainer 20 is made rotatable with respect to the main body 12 by engaging the holes 23 with the support shafts 22 of the main body 12. As shown in FIG. 3, the retainer 20 is rotatable between a locking position where it covers the outer surfaces of the main body 12 (closed position, FIG. 8) and a non-locking position where it is pivoted upward away from the main body 12 (opened position, FIG. 3).

Rectangular engaging holes 24 are formed in the opposite lateral side walls of the retainer 20 in such positions as to be engageable with the corresponding engaging portions 19 of the terminal detecting members 18 of the connector housing 11. When the retainer 20 is pivoted to its locking position with the engaging portions 19 projecting outward, the engaging portions 19 are brought into engagement with the engaging holes 24 and the retainer 20 is locked in this position.

Three engaging projections 25 project downward from the inner surface of the retainer 20 in positions corresponding to three through holes 21 formed in the main body 12. When the retainer 20 is pivoted to its locking position, the locking projections 25 enter the terminal fitting cavities 13 through the holes 21 of the main body 12, thereby engaging corresponding engaging holes 16a of the terminal fittings 16.

Each locking projection 25 includes a vertical wall 25a vertically extending from the inner surface of the retainer 20 and slanting surfaces 25b and 25c formed at the bottom end of the vertical wall 25a. The slanting surfaces 25b and 25c are located at the opposite longitudinal sides of the vertical wall 25a which are away from and closer to the hood 14, respectively. The bottom end of the locking projection 25 is angled by these slanting surfaces 25b and 25c. The slanting surface 25c is a push-in slanting surface which exerts a push-in force to push the terminal fitting 16 to its proper mount position by pushing an opening edge (hereinafter, shoulder portion 16b) at the leading end of the engaging hole 16a of the terminal fitting 16. The slanting surface 25b is a push-out slanting surface which comes into sliding contact with the upper surface of the terminal fitting 16 while the terminal fitting 16 is inserted and exerts a push-out force to push back the terminal fitting 16. Particularly, the push-in slanting surface 25c is more steeply sloped than the push-out slanting surface 25b in this embodiment. Hence, the push-in force is stronger than the push-out force.

As shown in FIG. 5, an elastic member (biasing member) 26 formed unitarily with the retainer 20 projects backward from the middle of the rear end of the retainer 20. The elastic member 26 is formed such that it becomes thinner as it extends more backward. When the retainer 20 is pivoted toward its non-locking position from the locking position where it covers the main body 12, the leading end of the elastic member 26 comes into contact with the upper surface of the main body 12 and the elastic member 26 undergoes elastic deformation to warp. As a result, the retainer 20 is biased to pivot toward its locking position.

Next, the action of this embodiment is described.

When the terminal fittings 16 are not inserted into the connector housing 11, the engaging portions 19 of the terminal detecting members 18 do not project outward from the main body 12 as shown in FIG. 2. Even if the retainer 20 is pivoted to its locking position in this state, the retainer 20 is not to be held in its locking position because the engaging portions 19 of the detecting members 18 are not engaged with the engaging holes 24 of the retainer 20. Thus, even if a plethora of connector housings 11 mounting the retainers 20 are merely put and transported in a container, the retainers 20 are not locked in their locking position due to vibrations produced during transportation, thereby securely preventing a cumbersome operation of returning the retainers 20 to their spaced positions during a process of inserting the terminal fittings 16.

When the terminal fittings 16 are inserted into the connector housings 11 transported to a place where the terminal fitting insertion is carried out, the respective terminal fittings 16 are inserted one after another, with their leading ends heading, into the cavities 13 of the connector housing 11 from the left side of the drawings.

The process of inserting the terminal fittings 16 into the respective cavities 13 is described in detail. The retainer 20 is normally held in its locking position due to an elastic force rendered from the elastic member 26 and thus the locking projections 25 are projecting into the cavities 13 through the holes 21. Accordingly, when the terminal fittings 16 are inserted, the upper surfaces of the leading ends thereof come into contact with the push-out slanting surfaces 25b of the locking projections 25. If the terminal fittings 16 are further inserted, they move in sliding contact with the push-out slanting surfaces 25b, thereby lifting the retainer 20 against the elastic force from the elastic member 26. As a result, the retainer 20 is pivoted away from the main body 12.

When the terminal fittings 16 are further inserted, the shoulder portions 16b thereof move out of contact with the push-out slanting surfaces 25b and come into contact with the push-in slanting surfaces 25c. Then, a push-in force which acts in an opposite direction from the push-out force which has been acting is exerted on the terminal fittings 16, thereby pushing them to their proper mount positions. In other words, the elastic force from the elastic member 26 transmitted by way of the push-in slanting surfaces 25c is translated into the push-in force which acts to push the shoulder portions 16b of the terminal fittings 16 inwardly. Thus, if the terminal fittings 16 are inserted with a force sufficient for the shoulder portions 16b of the terminal fittings 16 to pass the push-out slanting surfaces 25c, they can be securely inserted to their proper mount positions because of a static energy stored in the warped elastic member 26. Hence, the push-in force of the retainer 25 is exerted additionally to the external terminal inserting force. In this embodiment, since the push-in slanting surfaces 25c is more steeply sloped than the push-out slanting surfaces 25b, the push-in force is stronger than the push-out force. Thus, the operation of pushing the terminal fittings 16 to their proper mount positions is facilitated and more secure.

The outer side surfaces of the terminal fittings 16, when being inserted into the cavities 13 located at the opposite lateral sides, come into contact with the bent portions 18a of the terminal detecting members 18 of the connector housing 11. Thereby, the detecting members 18 undergo elastic deformation in such a manner that they are pressed outward, and the engaging portions 19 at the leading ends of the detecting members 18 project outward from the main body 12 (a state shown in FIG. 7).

If the retainer 20 is pressed downward to cover the main body 12 in this state, the bottom end faces of the lateral side walls of the leading end of the retainer 20 come into contact with the engaging portions 19 of the detecting members 18 and the lateral side walls are caused to elastically deform so that they are spaced wider apart. The retainer 20 eventually comes to its locking position where its lateral side walls cover the engaging portions 19. In this position, the engaging portions 19 are engaged with the corresponding engaging holes 24, making it impossible for the retainer 20 to rotate (see FIGS. 4 and 8). In the locking position of the retainer 20, the locking projections 25 (particularly the vertical walls 25a thereof) projecting from the inner surface of the retainer 20 are engaged with the engaging holes 16a of the terminal fittings 16, thereby securely locking the terminal fittings in the cavities 13.

According to this embodiment, the retainer 20 can be held in its locking position only after the terminal fittings 16 are inserted into the connector housings 11. Thus, the retainer 20 can be securely prevented from being held in its locking position during transportation of the connector housings 11 into which the terminal fittings 16 have not yet been inserted. Since labor and time to return the retainer 20 inadvertently held in its locking position to its unlocking position can be saved, the operation of inserting the terminal fittings 16 into the connector housing 11 can be performed more efficiently. Further, a production cost can be reduced because a container used when transporting the connector housings 11 needs not have a special structure for preventing the retainers 20 from being brought into their locking positions.

As described above, in this embodiment, if the terminal fittings 16 are inserted with a force sufficient to move the shoulder portions 16b thereof over the push-out slanting surfaces 25b, they can be, thereafter, automatically introduced to their proper mount positions by the static energy stored in the elastic member 26. This securely avoids a problem of incomplete insertion. Further, the connector of this embodiment is not provided with engaging portions or lances in the cavities 13. The terminal fittings 16 are locked only by engagement of the locking projections 25 of the retainer 20 with the engaging holes 16a. Normally, engaging portions or lances are adapted to temporarily retain the already inserted terminal fitting 16 so as not to come out of the cavity 13 while the other terminal fittings 16 are inserted. If the number of terminal fittings 16 to be inserted is small as in this embodiment, omission of the engaging portions or lances does not cause any large hindrance in practice. Such omission simplifies the internal construction of the connector and obviates the need to provide a space within which the engaging portion or lance is movable, contributing to fabrication of the main body 12 of smaller size.

The invention is not limited to the above-described and illustrated embodiment. For example, it may not be necessary to rotatably mount the retainer on the connector housing. As in the prior art connector of FIG. 10, the retainer may be movably mountable on the connector housing along an insertion/withdrawal direction. In other words, if the connector is such that the connector housing is formed with a terminal detecting member having an engaging portion which projects when it is in contact with the terminal fitting and the retainer is engageable with this engaging portion, the retainer can be held in its locking position only when the terminal fittings are inserted. Accordingly, a desired object can be fully accomplished.

Figure 10:
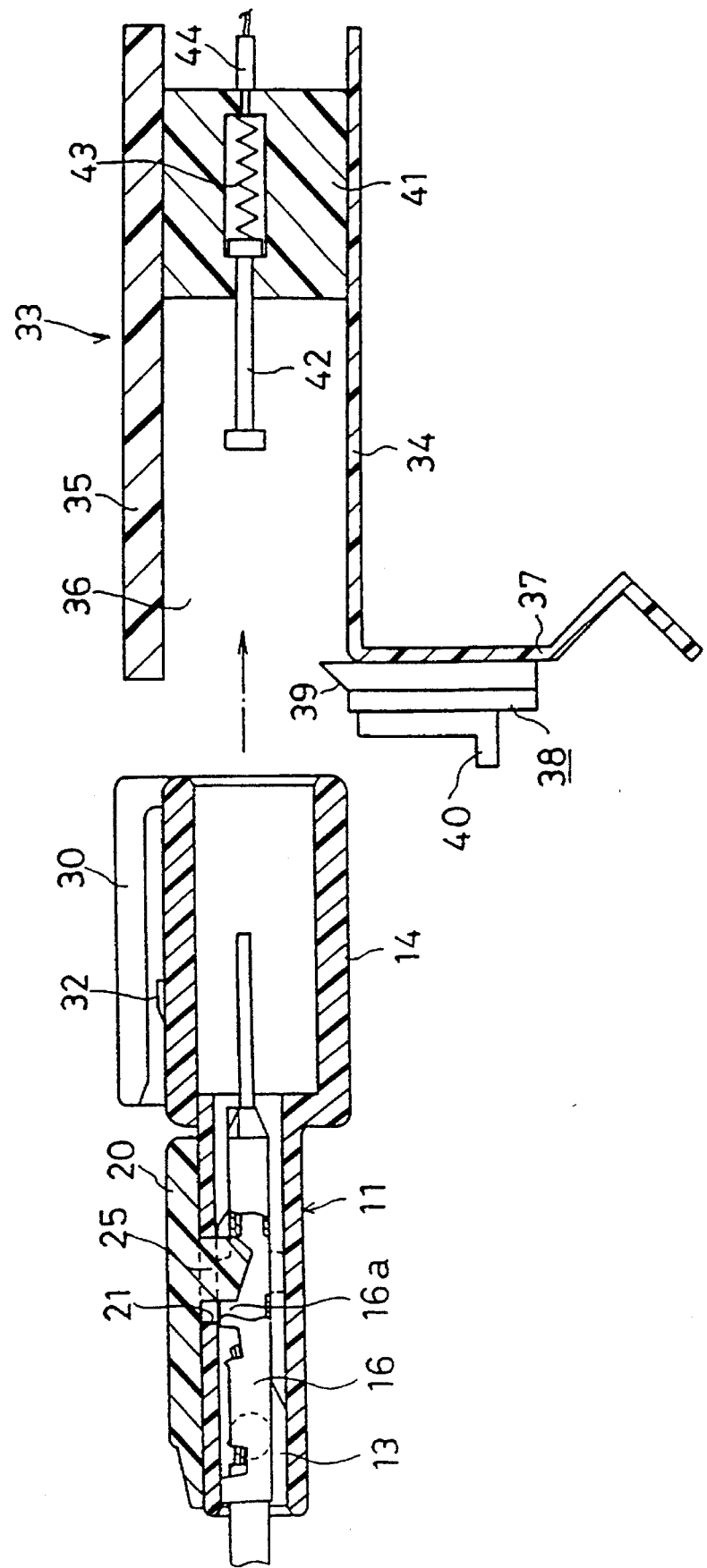
FIG. 10 is a section of a detector.

In the case where the insertion of the terminal fittings 16 is unduly insufficient, the locking projections 25 come into contact with portions of the terminal fittings 16 before the shoulder portions 16b even if the retainer 20 is pressed downward. Thus, the retainer 20 cannot be pivoted to its locking position and results in a state where it is lifted from the main body 12. Normally, an operator notices improper mounting of the retainer 20 and inserts the terminal fittings 16 again. If the connector with the improperly mounted retainer 20 should be transported to a place where it is attached to a fixed member, incomplete insertion of the terminal fittings 16 is detected by a detector 33 as shown in FIG. 10.

Figure 11:
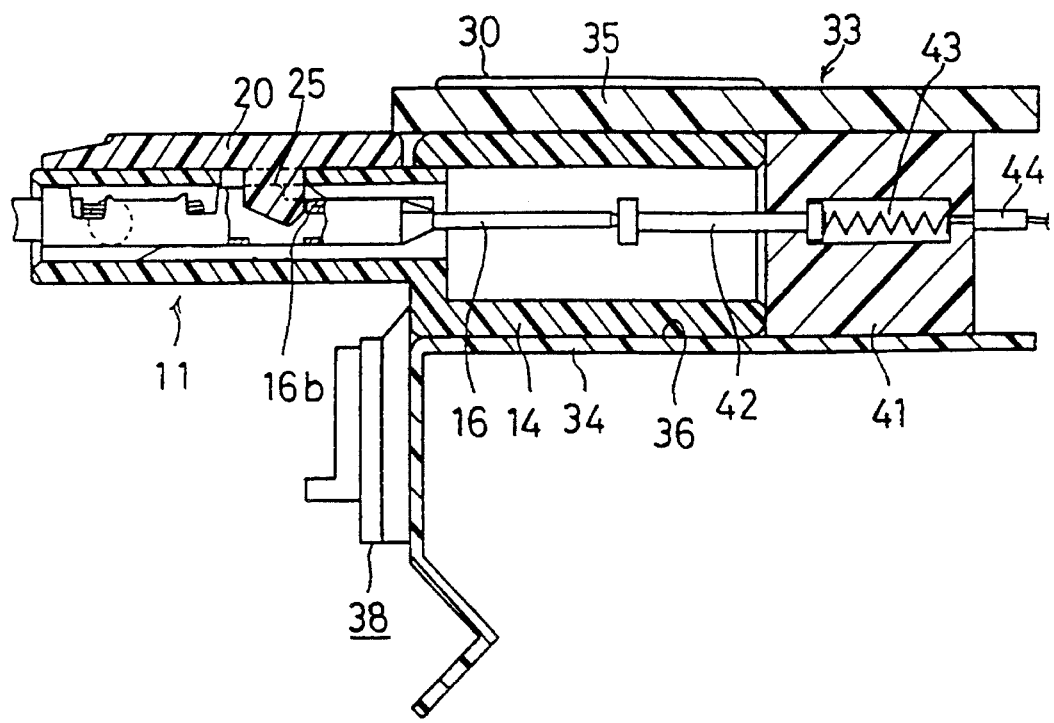
FIG. 11 is a section showing how detection is made when terminal fittings are in their proper mount positions.
Figure 12:
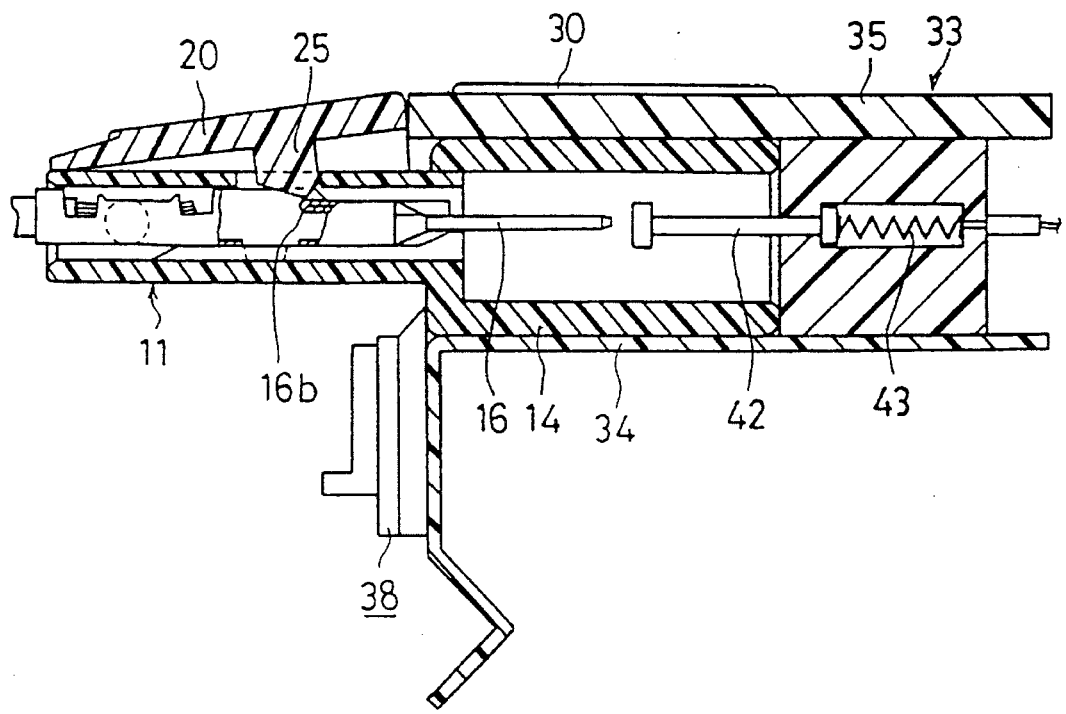
FIG. 12 is a section showing how detection is made when terminal fittings are incompletely mounted.

The detector 33 includes a base plate 34 and detecting plates 35 opposed to and spaced away from each other above the base plate 34. The plates 34 and 35 form a connector holder 36 for holding the hood 14 of the main body 12. A left end of the base plate 34 is bent downward to form a mount portion 37. A locking mechanism 38 for locking the hood 14 during detection is mounted on the mount portion 37. The locking mechanism 38 is movably mounted on the mount portion 37 along the vertical direction and is provided internally with an unillustrated spring. This spring constantly biases the locking mechanism 38 so that an upper end thereof projects into the connector holder 36 as shown in FIGS. 10 to 12. The hood 14 being inserted into the connector holder 36 comes into contact with a guide surface 39, thereby pressing the locking mechanism 38 downward. When the hood 14 is completely inserted into the connector housing 36, the locking mechanism 38 moves upward and engages the hood 14, thereby locking the main body 12. The locking state can be released by pressing down a releaser 40 formed in the locking mechanism 38.

A checker holder 41 is provided between the base plate 34 and the detecting plates 35. Contact pins 42 are carried by the holder 41 in correspondence with the respective terminal fittings 16 in such a manner that they horizontally project from the holder 41. The contact pins 42 are of conductive material and are biased by corresponding springs 43 so as to constantly project. Hence, the contact pins 42 will be brought into contact with the leading ends of the corresponding terminal fittings 16 if those are in their proper mount positions. Further, the contact pins 42 are connected with an unillustrated conduction detecting circuit by way of lead wires 44. The conduction detecting circuit is of known type which detects the presence of a conductive state which is established when the contact pins 42 are in contact with the terminal fittings 16.

The detecting plates 35 have such a length that they entirely cover the hood 14 and touch the leading end of the retainer 20 when the hood 14 is completely inserted into the connector holder 36. More specifically, when the terminal fittings 16 are in their proper mount positions, the retainer 20 is closely in contact with the main body 12 and the upper surface of the retainer 20 is substantially in flush with the upper surface of the hood 14 as shown in FIG. 11. Accordingly, the detecting plates 35 cover the hood 14 and slightly touch the upper surface of the retainer 20. In the case where insertion of the terminal fittings 16 is unduly insufficient and the shoulder portion 16b of the terminal fittings 16 have not yet passed the push-out slanting surfaces 25b of the locking projections 25 as shown in FIG. 12, the detecting plates 35 block the retainer 20 because the retainer 20 is lifted from the main body 12.

By using the detector 33 as described above, incomplete insertion of the terminal fittings 16 results in non-contact states of the contact pins 42 with the terminal fittings 16 and can be immediately detected by the conduction detecting circuit. Further, in this embodiment, the detecting plates 35 block the retainer 20 when the terminal fittings 16 are incompletely inserted, thereby assuring a specified distance between the contact pins 42 and the terminal fittings 16 in the case of incomplete insertion of the terminal fittings 16. With a detector not provided with such a blocking mechanism, the leading ends of the terminal fittings 16 are brought into contact with the contact pins 42 if the connector is forced into the detector despite incomplete insertion of the terminal fittings 16, with the result that they may be broken or deformed. With the detector 33 of this embodiment, the terminal fittings will not be damaged.

Figure 13:
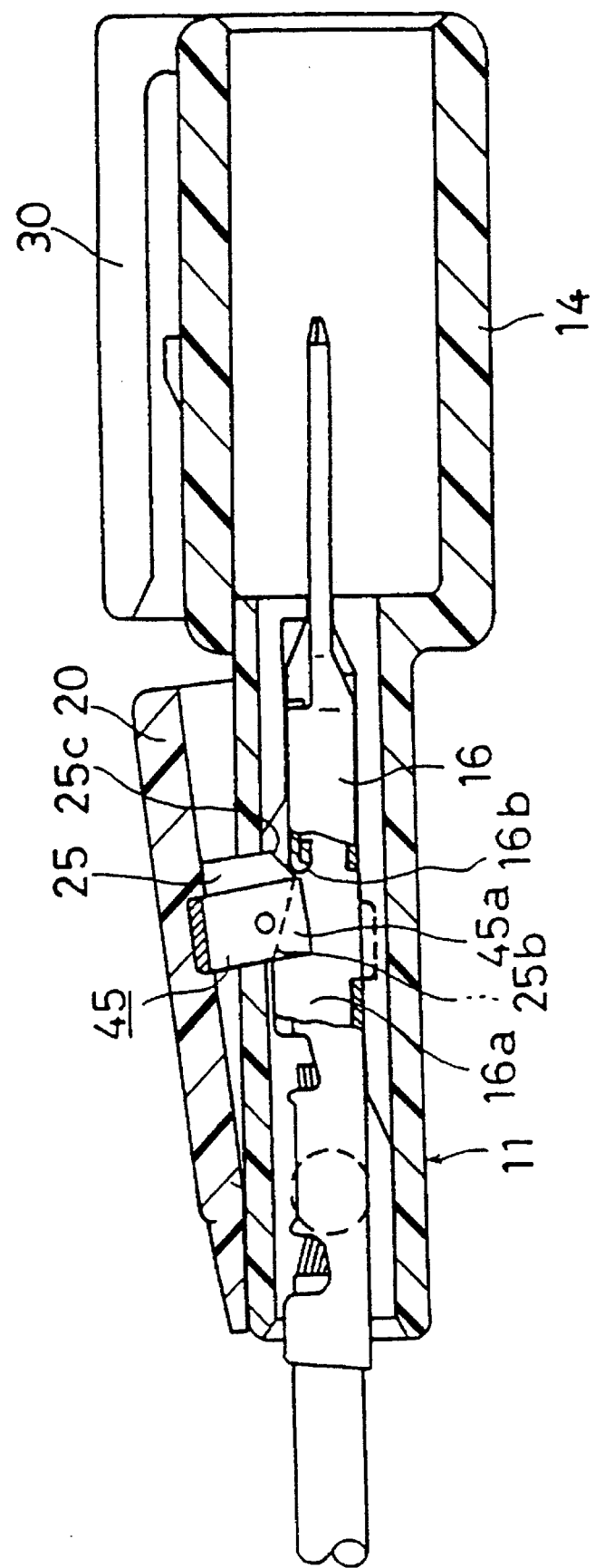
FIG. 13 is a side view in section of the connector when a short-circuit member is mounted.
Figure 14:
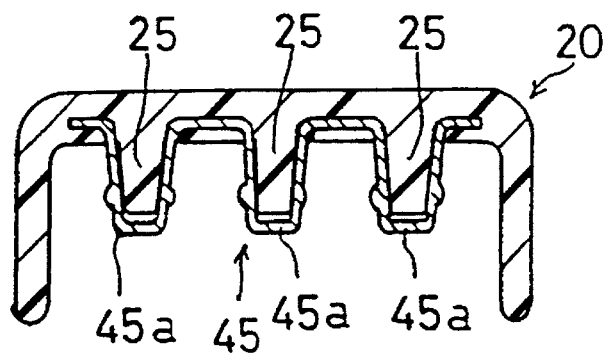
FIG. 14 is a section of a retainer provided with the short-circuit member.

FIGS. 13 and 14 show a connector in which a short-circuit member 45 for short-circuiting the terminal fittings 16 is mounted on the locking projections 25 of the retainer 20. The short-circuit member 45 is of thin conductive metal plate material, which is bent to unitarily form three contact portions 45a corresponding to the respective locking projections 25. The short-circuit member 45 is made integral with the retainer 20 by inserting the opposite ends and portions connecting the contact portions 45a into the retainer 20 (the short-circuit member 45 may be mounted on the locking projections 25 by means of injection or other method after the retainer 20 is formed).

The contact portions 45a are formed so as to conform to the shape of the locking projections 25 and mounted such that they cover the push-out slanting surfaces 25b, but not the push-in slanting surfaces 25c. Accordingly, when the terminal fittings 16 are inserted until they reach the push-in slanting surfaces 25c, they can be inserted to their proper mount positions with the assist of the push-in force from the push-in slanting surfaces 25c as described above. When the retainer 20 is in its locking position, the respective contact portions 45a together with the locking projections 25 are engaged with the engaging holes 16a of the terminal fittings 16, thereby establishing electrical contacts with the terminal fittings 16. As a result, the terminal fittings 16 are short-circuited.

Figure 15:
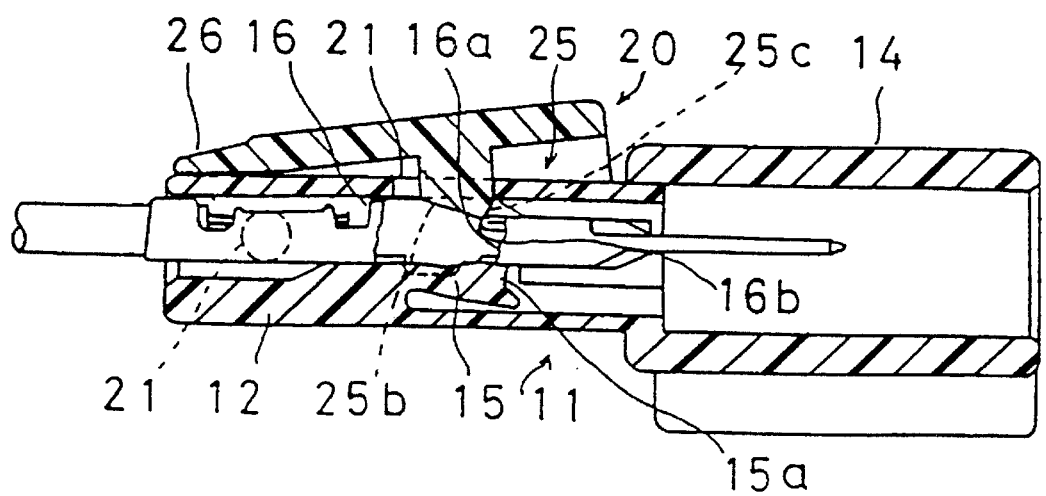
FIG. 15 is a side view in section of a modification of the connector of FIG. 1.
Figure 16:
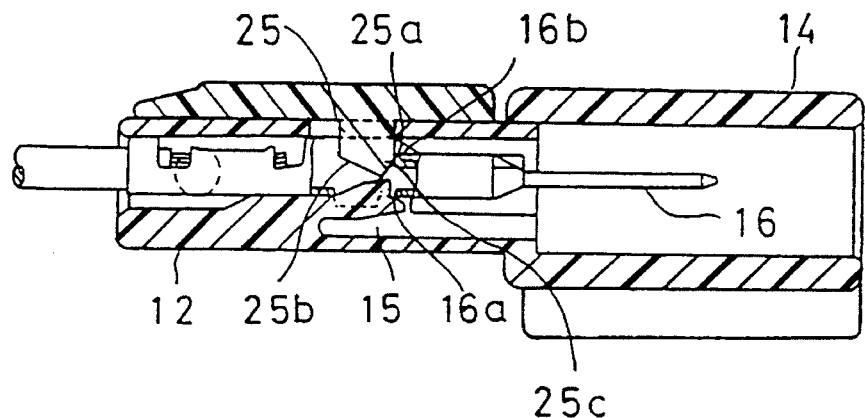
FIG. 16 shows the modified connector in a view similar to FIG. 9.
Figure 17:
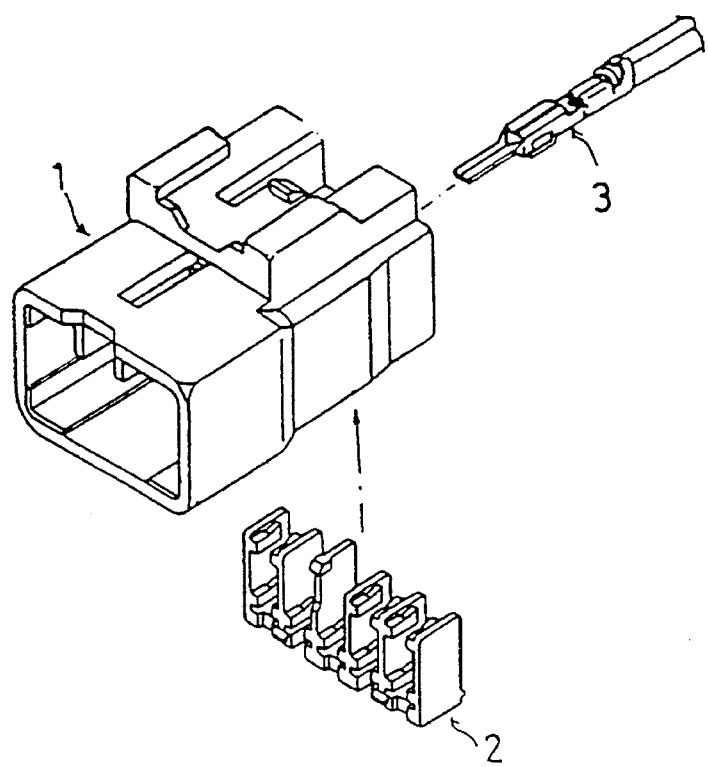
FIG. 17 is an exploded perspective view of a prior art connector.

A modification of the first embodiment of the invention is described with reference to FIGS. 15 and 16. Some parts are given same reference numerals.

The modification differs from the first embodiment in that in the middle of the bottom of each cavity 13, an engaging portion or lance 15 having an engaging claw 15a is unitarily formed with the housing main body with being supported only at one longitudinal end away from the hood 14. The engaging portions 15 are adapted to engage corresponding engaging holes 16a of terminal fittings 16 to be inserted into the cavities 13 from the left side in FIG. 1, so that the terminal fittings 16 can be lockingly retained in the cavities 13.

As the terminal fittings 16 are inserted, the leading ends of the engaging portions 15 of the connector housing 11 is elastically deflected by being pressed downward by the lower surface of the terminal fittings 16, thereby permitting entrance of the terminal fittings 16. When the terminal fittings 16 reach their proper mount positions, the engaging holes 16a are brought to the engaging claws 15a of the engaging portions 15. The engaging claws 15a are then engaged with the engaging holes 16a of the terminal fittings 16, thereby lockingly retaining the terminal fittings 16.

Hence, although as stated to be unnecessary in the first embodiment, the modified embodiment provides additional locking means for locking the terminal fittings within the cavities 13. Conclusively, this modification is preferably adopted if the requirements with respect to security are particularly high.

It should be appreciated that the invention may be embodied in several forms. Although the terminal detecting members are movable in the foregoing embodiments, they are not particularly limited to these, but may be merely such projections engageable with the engaging holes of the retainer.

What is claimed is:

1. A connector, comprising:
   a connector housing (11) formed with a cavity (13) for accommodating a terminal fitting (16), a retainer (20) having a portion which is pivotally mounted on the connector housing (11) such that the retainer is movable between a locking position and a non-locking position, said retainer having a locking portion (25) for locking the terminal fitting (16) inserted into the cavity (13), said retainer further comprising a resilient biasing member (26) spaced from said portion of said retainer which is pivotally mounted on the connector housing (11) for resiliently biasing the retainer (20) toward the locking position.

2. A connector according to claim 1, wherein the locking portion (25) is formed with a push-out slanting surface (25b) with which the terminal fitting (16) comes into contact during insertion terminal fitting (16) into the cavity (13), such that engagement of the terminal fitting (16) with the push-out slanting the retainer (20) away from the locking position and against resilient forces exerted by the biasing member (26).

3. A connector according to claim 2, wherein the locking portion (25) is formed with a push-in slanting surface (25c) which is inversely sloped of the push-out slanting surface (25b) and pushes the terminal fitting (16), having during the insertion passed the push-out slanting surface (25b), in such a direction that the terminal fitting (16) is inserted to its proper mount position in the cavity (13).

4. A connector according to claim 3, wherein the push-in slanting surface (25c) is more steeply sloped than the push-out slanting surface (25b).

5. A connector according to claim 1, wherein the biasing member (26) is formed unitarily with the retainer (20).

6. A connector comprising:
   a connector housing (11) formed with a cavity (13) for accommodating a terminal fitting (16), said housing (11) having a terminal detecting member (18) which is formed at the housing (11) and which projects deflectably into said cavity (13) such that said terminal detecting member (18) is contacted by the terminal fitting (16) during insertion of the terminal fitting (16) to a proper mount position in the cavity (13), said terminal detecting member (18) being deflectable outwardly from said housing (11) upon complete insertion of said terminal fitting (16) into the cavity (13) for providing indication of said proper mount position.

7. A connector according to claim 6, wherein the terminal detecting member (18) projects biasingly into the cavity (13).

8. A connector comprising:

a connector housing (11) formed with a cavity (13) for accommodating a terminal fitting (16), a terminal detecting member (18) which is formed at the housing (11) and which is contacted by the terminal fitting (16) during insertion of the terminal fitting (16) into a proper mount position in the cavity (13), said terminal detecting member (18) including an engaging portion (19) which deflects into an engaging position when the terminal fitting (16) contacts the terminal detecting member (18)

a retainer (20) which is movably mounted on the connector housing (11) between a locking position and a non-locking position, and which is formed with a locking portion (25) for locking the terminal fitting (16) inserted into the cavity (13), and another engaging portion (24) formed at the retainer (20) which engages the engaging portion (19) when the terminal fitting (16) is in its proper mount position.

9. A connector according to claim 8, wherein the terminal detecting member (18), after insertion of the terminal fitting (16) to its proper mount position, projects out of the connector housing (11), thereby forming the engaging portion (19), and wherein said another engaging portion of the retainer (20) is defined by an engaging hole (24), for engaging the engaging portion (19) projecting out of the connector housing (11), so that the retainer (20) is held in the locking position.

10. A connector according to claim 9, wherein the engaging portion (19) of the terminal detecting member (18) projects laterally out of the connector housing (11) and, wherein the engaging hole (24) is formed in a lateral side wall of the retainer (20).

11. A connector comprising:

a connector housing (11) formed with a cavity (13) for accommodating a terminal fitting (16), a retainer (20) rotatably mounted on the connector housing (11) and movable between a locking position and a non-locking position, said retainer being formed with a locking portion (25) for locking the terminal fitting (16) inserted into the cavity (13) a biasing member (26) located on the retainer (20) at a location spaced from the locking portion (25), the biasing member (26) engaging an outer surface of the connector housing (11) when the retainer (20) is rotatably disposed in the non-locking position, such that said biasing member (26) urges said retainer toward the locking position.

12. A connector according to claim 11, wherein the biasing member is a tongue (26) projecting from the backside of the retainer (20).

* * * * *